(12) United States Patent
Yoshida et al.

(10) Patent No.: US 11,195,803 B2
(45) Date of Patent: Dec. 7, 2021

(54) SEMICONDUCTOR ELEMENT, SEMICONDUCTOR DEVICE, POWER CONVERSION DEVICE, AND METHOD OF MANUFACTURING SEMICONDUCTOR ELEMENT

(71) Applicant: Mitsubishi Electric Corporation, Tokyo (JP)

(72) Inventors: Motoru Yoshida, Tokyo (JP); Jun Fujita, Tokyo (JP); Yuji Sato, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 44 days.

(21) Appl. No.: 16/957,109

(22) PCT Filed: Mar. 8, 2018

(86) PCT No.: PCT/JP2018/008919
§ 371 (c)(1),
(2) Date: Jun. 23, 2020

(87) PCT Pub. No.: WO2019/171523
PCT Pub. Date: Sep. 12, 2019

(65) Prior Publication Data
US 2020/0395314 A1    Dec. 17, 2020

(51) Int. Cl.
*H01L 23/00* (2006.01)
*H01L 21/311* (2006.01)
(Continued)

(52) U.S. Cl.
CPC ...... *H01L 23/564* (2013.01); *H01L 21/31133* (2013.01); *H01L 21/31144* (2013.01);
(Continued)

(58) Field of Classification Search
CPC ............ H01L 23/564; H01L 21/31133; H01L 21/31144; H01L 23/293; H01L 23/3157;
(Continued)

(56) References Cited

U.S. PATENT DOCUMENTS

| 2019/0057873 A1 | 2/2019 | Sugahara et al. |
| 2019/0206987 A1 | 7/2019 | Adachi et al. |

FOREIGN PATENT DOCUMENTS

| JP | 2005-057125 A | 3/2005 |
| JP | 2007-019412 A | 1/2007 |

(Continued)

OTHER PUBLICATIONS

International Search Report and Written Opinion dated May 15, 2018 for PCT/JP2018/008919 filed Mar. 8, 2018, 11 pages including English Translation of the International Search Report.

*Primary Examiner* — Elias Ullah
(74) *Attorney, Agent, or Firm* — Xsensus LLP (57) ABSTRACT

An object is to provide a technique capable of suppressing a corrosion of a first electrode and a second electrode. A semiconductor element includes a semiconductor substrate, an Al electrode, a polyimide member selectively disposed on the Al electrode, and an Ni electrode. The polyimide member includes a protruding part which protrudes in a plane direction of an upper surface of the Al electrode and which has a lower portion having contact with the Al electrode in a cross-sectional view, in at least part of a peripheral part of the polyimide member in a top view. The Ni electrode is disposed on the Al electrode and the protruding part.

13 Claims, 6 Drawing Sheets

(51) Int. Cl.
  *H01L 23/29* (2006.01)
  *H01L 23/31* (2006.01)
  *H01L 23/367* (2006.01)
  *H01L 23/373* (2006.01)
  *H01L 29/45* (2006.01)
  *H02P 27/08* (2006.01)

(52) U.S. Cl.
  CPC ........ *H01L 23/293* (2013.01); *H01L 23/3157* (2013.01); *H01L 23/367* (2013.01); *H01L 23/3735* (2013.01); *H01L 23/562* (2013.01); *H01L 24/32* (2013.01); *H01L 29/45* (2013.01); *H01L 2224/32225* (2013.01); *H01L 2924/07025* (2013.01); *H01L 2924/10253* (2013.01); *H01L 2924/10272* (2013.01); *H01L 2924/13091* (2013.01); *H01L 2924/15787* (2013.01); *H01L 2924/3512* (2013.01); *H02P 27/08* (2013.01)

(58) Field of Classification Search
  CPC ............... H01L 23/367; H01L 23/3735; H01L 23/562; H01L 24/32; H01L 29/45; H01L 2224/32225; H01L 2924/07025; H01L 2924/10253; H01L 2924/10272; H01L 2924/13091; H01L 2924/15787; H01L 2924/3512; H01L 29/7827; H01L 29/1608; H01L 2224/48247; H01L 2224/73265; H02P 27/08
  USPC ........................................................ 257/703
  See application file for complete search history.

(56) References Cited

FOREIGN PATENT DOCUMENTS

| | | |
|---|---|---|
| JP | 2013-016538 A | 1/2013 |
| JP | 2014-032985 A | 2/2014 |
| JP | 2015-198134 A | 11/2015 |
| JP | 2017-005037 A | 1/2017 |
| WO | 2010/125639 A1 | 11/2010 |
| WO | 2017/169086 A1 | 10/2017 |
| WO | 2017/187670 A1 | 11/2017 |

| CURVATURE RADIUS R [μm] | 20 | 100 | 200 | 400 | 500 OR LARGER |
|---|---|---|---|---|---|
| DETERMINATION OF CRACK | × | × | ○ | ○ | ○ |

SEMICONDUCTOR ELEMENT, SEMICONDUCTOR DEVICE, POWER CONVERSION DEVICE, AND METHOD OF MANUFACTURING SEMICONDUCTOR ELEMENT

CROSS-REFERENCE TO RELATED APPLICATIONS

The present application is based on PCT filing PCT/JP2018/008919, filed Mar. 8, 2018, the entire contents of which are incorporated herein by reference.

TECHNICAL FIELD

The present invention relates to a semiconductor element, a semiconductor device, a power conversion device, and a method of manufacturing the semiconductor element.

BACKGROUND ART

A semiconductor element using silicon (Si) or silicon carbide (SiC), for example, as a base material is often used in a semiconductor device applied to a power module. In accordance with increase in a capacity of current flowing in a power module, an operation under a temperature exceeding 175° C. is required of the power module. Accordingly, an electrode structure of the semiconductor element used in the power module is desired to be changed to have a high thermal resistance.

From a viewpoint of the high thermal resistance, conventionally proposed is a power module in which a cooler is bonded to the semiconductor element via an insulating substrate. On the other hand, a structure of reducing a thermal stress is proposed from a viewpoint of reducing a deformation of an electrode of the semiconductor element due to the thermal stress. For example, Patent Document 1 proposes a semiconductor element in which a buffer insulating film is disposed on an interlayer insulating film and a conducting body part as a stress relaxation member.

PRIOR ART DOCUMENTS

Patent Documents

Patent Document 1: International Publication No. 2010/125639

SUMMARY

Problem to be Solved by the Invention

Even a technique described above has a problem that when a semiconductor element including a wiring electrode mainly made of aluminum (Al) is operated under a temperature exceeding 175° C., a change in a shape of the wiring electrode occurs and a reliability of the semiconductor element is reduced. Considered accordingly is a configuration that the material of the wiring electrode mainly made of Al is changed to a laminated body of nickel (Ni) which is a high-melting-point material and Al.

In this configuration, an Ni film is formed in an opening part of a polyimide film formed on an Al wiring electrode for preventing a creeping discharge after forming the Al wiring electrode. However, a sticking force between the Ni film and the polyimide film is relative small, thus a void occurs in a boundary therebetween, and the Al wiring electrode and an electrode of the Ni film are locally eroded from the void in some cases.

The present invention therefore has been made to solve problems as described above, and it is an object of the present invention to provide a technique capable of suppressing a corrosion of a first electrode such as the Al wiring electrode and a second electrode such as the Ni electrode.

Means to Solve the Problem

A semiconductor element according to the present invention includes: a base including a semiconductor; a first electrode disposed on the base; and an organic resin member selectively disposed on the first electrode, wherein the organic resin member includes a protruding part which protrudes in a plane direction of an upper surface of the first electrode and which has a lower portion having contact with the first electrode in a cross-sectional view, in at least part of a peripheral portion of the organic resin member in a top view, the semiconductor element further includes a second electrode disposed on the first electrode and the protruding part.

Effects of the Invention

According to the present invention, the organic resin member includes a protruding part which protrudes in a plane direction of an upper surface of the first electrode and which has a lower portion having contact with the first electrode in a cross-sectional view, in at least part of a peripheral portion of the organic resin member in a top view, and a second electrode is disposed on the first electrode and the protruding part. According to such a configuration, a corrosion of the first electrode and the second electrode can be suppressed.

These and other objects, features, aspects and advantages of the present invention will become more apparent from the following detailed description of the present invention when taken in conjunction with the accompanying drawings.

DESCRIPTION OF EMBODIMENT(S)

Embodiment 1

Before describing a semiconductor element according to an embodiment 1 of the present invention, a semiconductor element related thereto (referred to as a "first related semiconductor element" hereinafter) is described.

Figure 1:
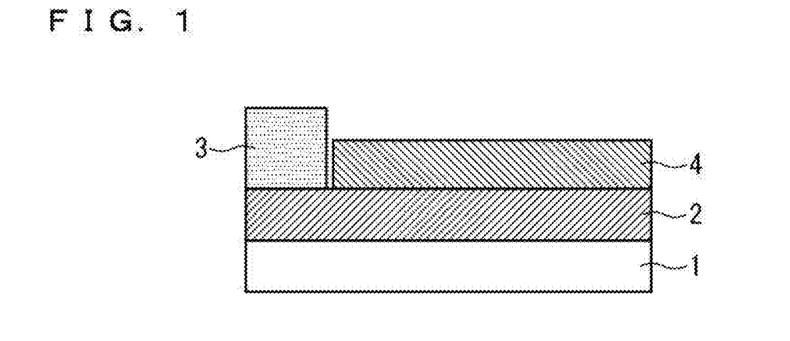
FIG. 1 A cross-sectional view illustrating a configuration of a first related semiconductor element.

FIG. 1 is a cross-sectional view illustrating a configuration of the first related semiconductor element. The first related semiconductor element in FIG. 1 includes a semiconductor substrate 1, an Al electrode 2, a polyimide member 3, and an Ni electrode 4. As illustrated in FIG. 1, a side surface of the polyimide member 3 is vertical to an upper surface of the Al electrode 2.

In such a configuration, a sticking force between the polyimide member 3 and the Ni electrode 4 is relatively small. Accordingly, when a reliability test or the like is performed on the semiconductor element in which the polyimide member 3 and the Ni electrode 4 are firmly attached to each other, a void occurs in a boundary between the polyimide member 3 and the Ni electrode 4, and the Al electrode 2 and the Ni electrode 4 are locally eroded from the void in some cases. In contrast, according to a semiconductor element in an embodiment 1 described hereinafter, such an occurrence of void can be suppressed.

Figure 2:
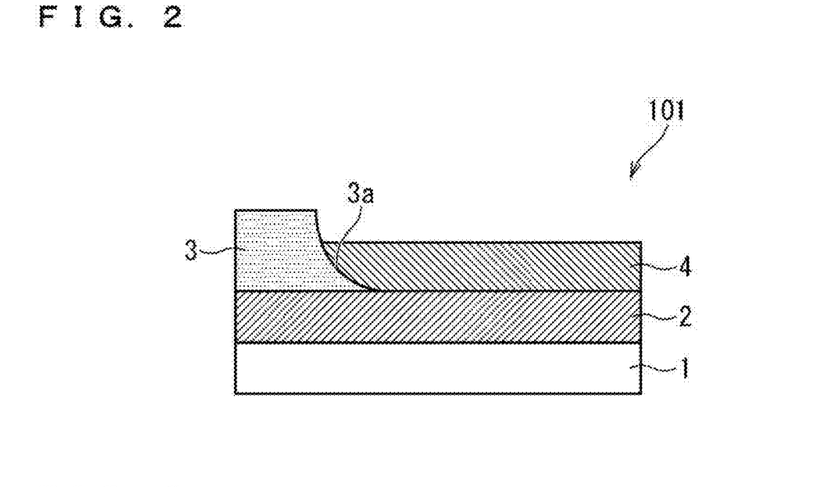
FIG. 2 A cross-sectional view illustrating a configuration of a semiconductor element according to an embodiment 1.

FIG. 2 is a cross-sectional view of a configuration of a semiconductor element 101 according to the present embodiment 1. The same reference numerals as those described above will be assigned to the same or similar constituent elements in the following drawings, and the different constituent elements are mainly described hereinafter.

The semiconductor element 101 in FIG. 2 includes the semiconductor substrate 1, the Al electrode 2, the polyimide member 3, and the Ni electrode 4.

The semiconductor substrate 1 is a base including a semiconductor. The base including the semiconductor is not limited to the semiconductor substrate 1, however, a semiconductor base is also applicable, for example. The base substrate of the semiconductor substrate 1 may include silicon (Si) or silicon carbide (SiC), for example. A wide band gap semiconductor such as SiC has a larger band gap than Si, thus it is advantageous to adopt this to the semiconductor substrate 1 from a viewpoint that an insulation breakdown field strength of the semiconductor element 101 is increased and the semiconductor element 101 is operated under a high temperature equal to or larger than 175° C. Described hereinafter is an example of a case where the semiconductor substrate 1 is an SiC substrate.

The Al electrode 2 is a first electrode disposed on the semiconductor substrate 1. The first electrode is not limited to an electrode including aluminum (Al), however, any metal layer made of Al, copper (Cu), AlSi, nickel (Ni), or gold (Au), for example, or a combination thereof may also be applicable.

The polyimide member 3 is an organic resin member selectively disposed on the Al electrode 2. The organic resin member is not limited to polyimide, however, an epoxy member and an acrylic member, for example, are also applicable.

The polyimide member 3 may have an island shape, an annular shape, or the other shape in a top view. As illustrated in FIG. 2, the polyimide member 3 includes a protruding part 3a which protrudes in a plane direction (lateral direction) of the upper surface of the Al electrode 2 and which has a lower portion having contact with the Al electrode 2 in a cross-sectional view, in at least part of a peripheral portion of the polyimide member 3 in a top view. An upper surface of the protruding part 3a is inclined with respect to the upper surface of the Al electrode 2, and has a skirt shape. The polyimide member 3 having the protruding part 3a with the shape illustrated in FIG. 2 can be pattern-formed by wet etching using a resist pattern-formed by a photolithography process as a mask, for example.

The Ni electrode 4 is the second electrode disposed on the Al electrode 2 and the protruding part 3a in a cross-sectional view. The second electrode is not limited to an electrode including Ni, however, any metal layer made of Ni, Cu, Ag (silver), or Au, for example, or a combination thereof may also be applicable.

According to the semiconductor element 101 in the present embodiment 1 described above, the Ni electrode 4 is disposed on the Al electrode 2 and the protruding part 3a in a cross-sectional view. According to such a configuration, an area in which the polyimide member 3 and the Ni electrode 4 are adjacent to each other can be increased, for example, thus the sticking force between the polyimide member 3 and the Ni electrode 4 can be increased. Accordingly, the occurrence of the void between the polyimide member 3 and the Ni electrode 4 can be suppressed, and as a result, a local corrosion of the Al electrode 2 and the Ni electrode can be suppressed.

When a thickness of the Ni electrode 4 not disposed on the protruding part 3a but disposed on the Al electrode 2 is smaller than 10 nm, a mutual diffusion occurs between the Ni electrode 4 and the Al electrode 2 as the base, and the Ni electrode 4 disappears in some cases. When the thickness of the Ni electrode 4 is larger than 100 μm, a warpage of a wafer such as the semiconductor substrate 1 increases due to a film stress of the Ni electrode 4, and a possibility of an occurrence of chipping increases in a subsequent dicing process, for example. Thus, the thickness of the Ni electrode 4 disposed on the Al electrode 2 is preferably equal to or larger than 10 nm and equal to or smaller than 100 μm.

Embodiment 2

Before describing a semiconductor element according to an embodiment 2 of the present invention, a semiconductor element related thereto (referred to as a "second related semiconductor element" hereinafter) is described.

Figure 3:
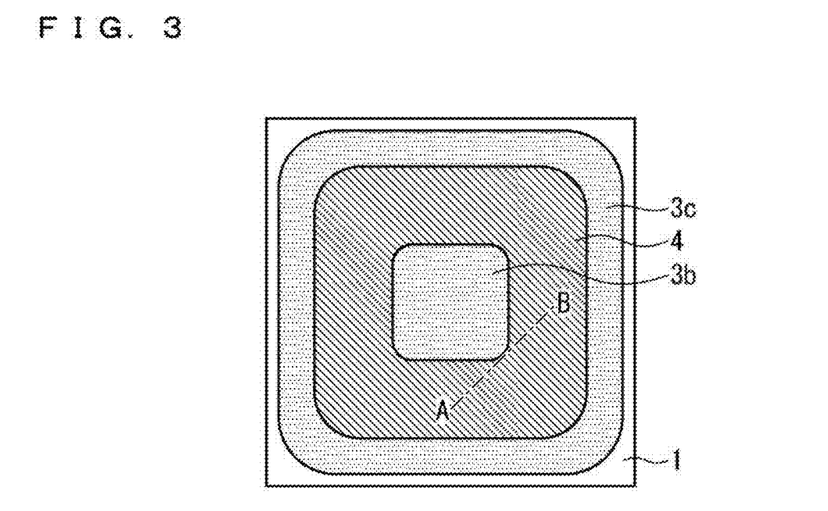
FIG. 3 A plan view illustrating a configuration of a second related semiconductor element.

FIG. 3 is a plan view illustrating a configuration of the second related semiconductor element. The second related semiconductor element in FIG. 3 includes polyimide members 3b and 3c disposed on the semiconductor substrate 1 via the Al electrode 2. The polyimide member 3c has an annular shape with an opening part exposing part of the upper surface of the Al electrode 2, and the polyimide member 3b and the Ni electrode 4 are located in the opening part.

The polyimide member 3b includes four corner portions as portions with convex shape extending outside from a peripheral portion of the polyimide member 3b in a plan view. The convex shape extending outside is provided to divide a plurality of electrode regions disposed on a surface of a device such as a metal oxide semiconductor field effect transistor (MOSFET), for example. In the second related semiconductor element, a tip portion of each of the four corner portions of the polyimide member 3b is relatively sharp, and a curvature radius of each tip portion is smaller than 200 μm. The protruding part 3a described in the embodiment 1 in a cross-sectional view is located in the peripheral part of the polyimide member 3b including the four corner portions in a plan view.

Figure 4:
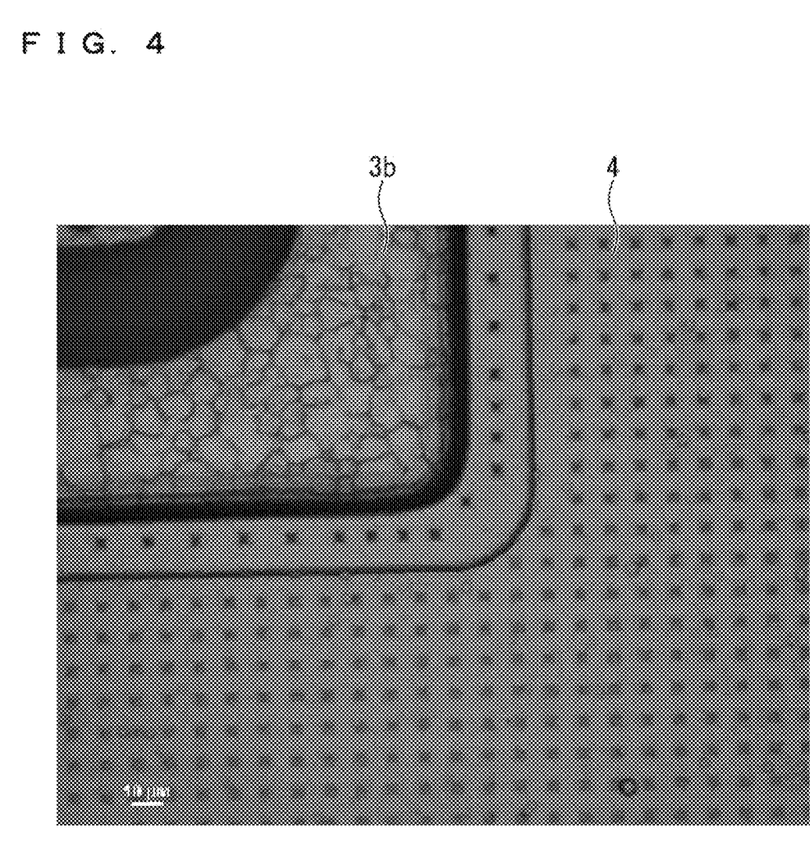
FIG. 4 A plan view illustrating the second related semiconductor element before a heat cycle test.
Figure 5:
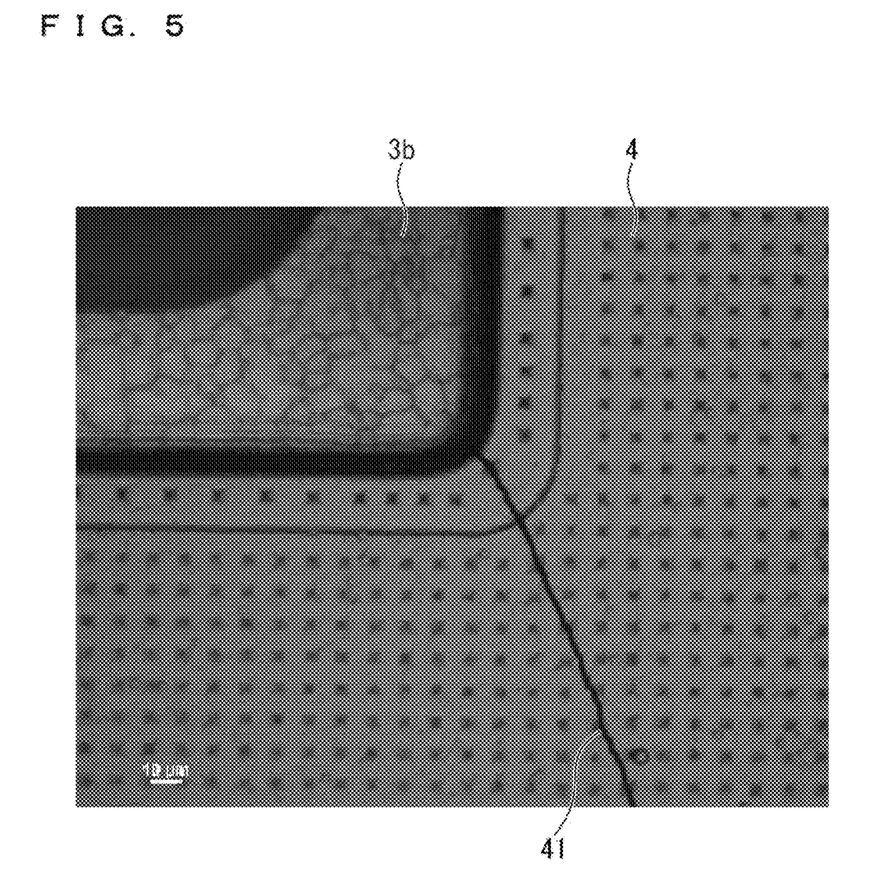
FIG. 5 A plan view illustrating the second related semiconductor element after the heat cycle test.

FIG. 4 is a drawing illustrating an upper surface image of the second related semiconductor element observed with an optical microscope before a heat cycle test, and FIG. 5 is a drawing illustrating the upper surface image of the second related semiconductor element observed with an optical microscope after the heat cycle test. A temperature change between −55° C. and 175° C., inclusive is repeated in the heat cycle test. As illustrated in FIG. 4 and FIG. 5, a crack 41 which has not been in the Ni electrode 4 before the heat cycle test occurs in the Ni electrode 4 near the corner portion of the polyimide member 3b after the heat cycle test.

Figure 6:
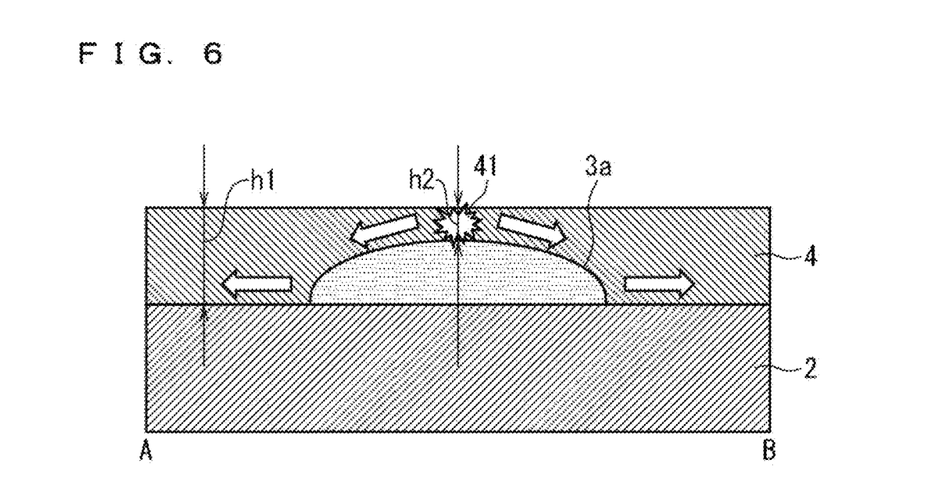
FIG. 6 A cross-sectional view illustrating a configuration of the second related semiconductor element.

FIG. 6 is a schematic cross-sectional view illustrating a configuration of the second related semiconductor element along an A-B line in FIG. 3. In this schematic cross-sectional view, the protruding part 3a of the polyimide member 3b is disposed on the Al electrode 2, and the Ni electrode 4 covers the Al electrode 2 and the protruding part 3a.

Herein, polyimide and Ni have a thermal conductivity of 0.16 W/m/K and 4.4 W/m/K, respectively, and have a heat expansion coefficient of 50 ppm/K and 12 ppm/K, respectively. A thermal stress caused by a difference between the thermal expansion coefficient of the polyimide member 3b including the protruding part 3a and the thermal expansion coefficient of the Ni electrode 4 occurs in the Ni electrode 4 adjacent to the polyimide member 3b in the heat cycle test. Specifically, the whole second related semiconductor element is expanded in a high temperature, and subsequently, the Ni electrode 4 having a high thermal conductivity is cooled earlier at the time of rapid cooling, and the polyimide member 3b having a low thermal conductivity is shrunk later.

That is to say, both the polyimide member 3b and the Ni electrode 4 are expanded in the high temperature, however, the Ni electrode 4 having a small linear expansion coefficient is subjected to a stress in tension in a plane direction (lateral direction) from the polyimide member 3b having a large linear expansion coefficient. The Ni electrode 4 having the high thermal conductivity loses heat earlier at the time of cooling, thus the temperature of the Ni electrode 4 gets lower than that of the polyimide member 3b, and the Ni electrode 4 is shrunk more rapidly than the polyimide member 3b having the low thermal conductivity. At this time, the Ni electrode 4 is subjected to the stress in tension from the polyimide member 3b in which the expansion is maintained. The occurrence of the stress described above is repeated in the heat cycle test, the crack 41 occurs in the Ni electrode 4. In contrast, according to the semiconductor element in the present embodiment 2 described hereinafter, such an occurrence of crack can be suppressed.

Figure 7:
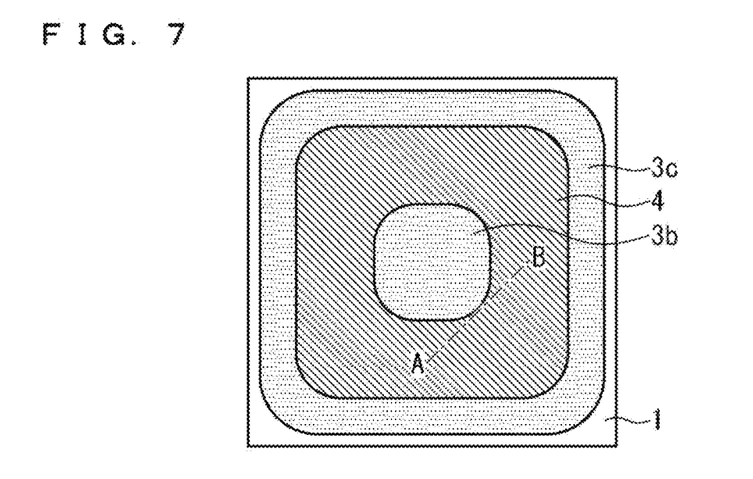
FIG. 7 A plan view illustrating a configuration of a semiconductor element according to an embodiment 2.

FIG. 7 is a plan view of a configuration of the semiconductor element 101 according to the present embodiment 2. The semiconductor element 101 includes the polyimide members 3b and 3c disposed on the semiconductor substrate 1 via the Al electrode 2 as the polyimide member 3. In the semiconductor element 101 in FIG. 7, the tip portion of each of the four corner portions of the polyimide member 3b is relatively flat, and has a curvature radius equal to or larger than 200 μm.

Figure 8:
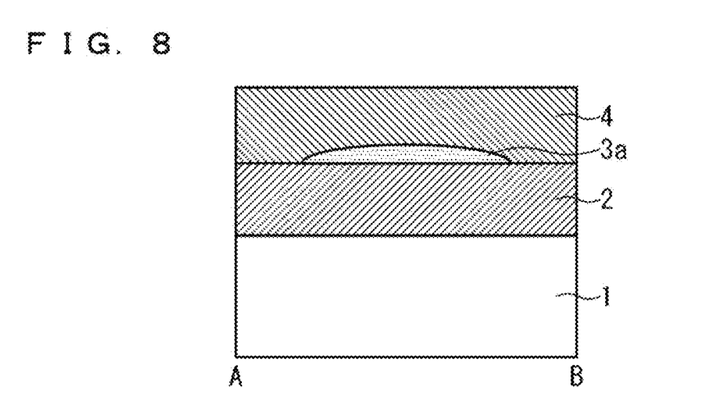
FIG. 8 A cross-sectional view illustrating a configuration of the semiconductor element according to the embodiment 2.
Figure 9:
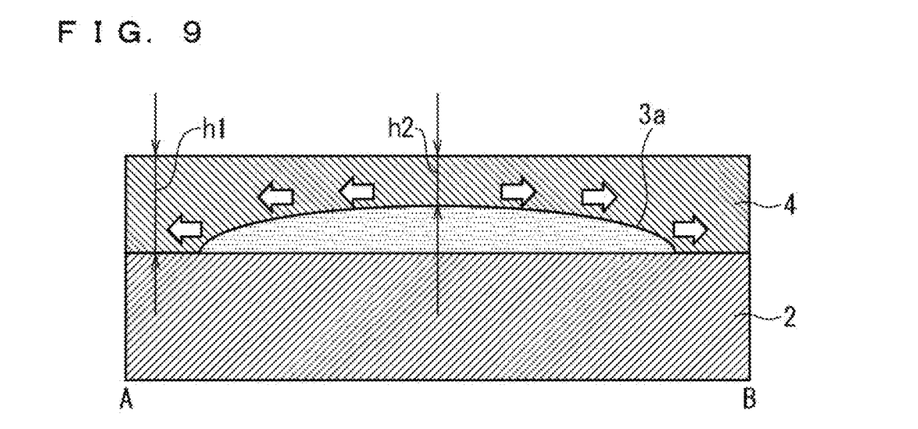
FIG. 9 A cross-sectional view illustrating a configuration of the semiconductor element according to the embodiment 2.

FIG. 8 is a schematic cross-sectional view of a configuration of the semiconductor element 101 according to the present embodiment 2 along an A-B line in FIG. 7, and FIG. 9 is a drawing enlarging part of FIG. 8. As illustrated in FIG. 8 and FIG. 9, the protruding part 3a of the polyimide member 3b has a shape thinner in an out-of-plane direction (vertical direction) and widened more in the plane direction (lateral direction) than the shape of the protruding part 3a in FIG. 6.

Shown in FIG. 6 and FIG. 9 are outline arrows each indicating a direction of the stress in tension to which the Ni electrode 4 is subjected from the polyimide member 3b in the heat cycle test. In the description hereinafter, a ratio of a thickness h2 to a thickness h1 illustrated in FIG. 6 and FIG. 9 is referred to as a "thickness ratio". The thickness h1 is a thickness of the Ni electrode 4 disposed on the Al electrode 2, and the thickness h2 is a minimum thickness of the Ni electrode 4 disposed on the protruding part 3a.

In a configuration where the thickness ratio is large as is the case in FIG. 6, the stress is concentrated on the surface of the Ni electrode 4. In this manner, when the thickness ratio of the Ni electrode 4 gets large, the stress in tension from the polyimide member 3b to the Ni electrode 4 is concentrated on a position in the Ni electrode 4 where the thickness ratio is largest, and the Ni electrode 4 cannot withstand the stress and the crack 41 occurs in that position, for example. In contrast, in a configuration where the thickness ratio is small and a change in the thickness of the Ni electrode 4 is small as is the case in FIG. 9, the stress in tension from the polyimide member 3b to the Ni electrode 4 occurring by a difference of the linear expansion coefficient between polyimide and Ni, that is to say, the stress to the surface of the Ni electrode 4 is diffused and reduced.

Recognized by the test performed by the inventors is a fact that the occurrence of the crack 41 is significantly suppressed when the thickness ratio is equal to or larger than 0.4. Specifically, in a case where the thickness of the Ni electrode 4 on the Al electrode 2 is 5 μm, the crack 41 is suppressed when the minimum thickness of the Ni electrode 4 on the protruding part 3a is equal to or larger than 2 μm, and in a case where the thickness of the Ni electrode 4 on the Al electrode 2 is 10 μm, the crack 41 is suppressed when the thickness of the Ni electrode 4 on the protruding part 3a is equal to or larger than 4 μm.

Figure 10:
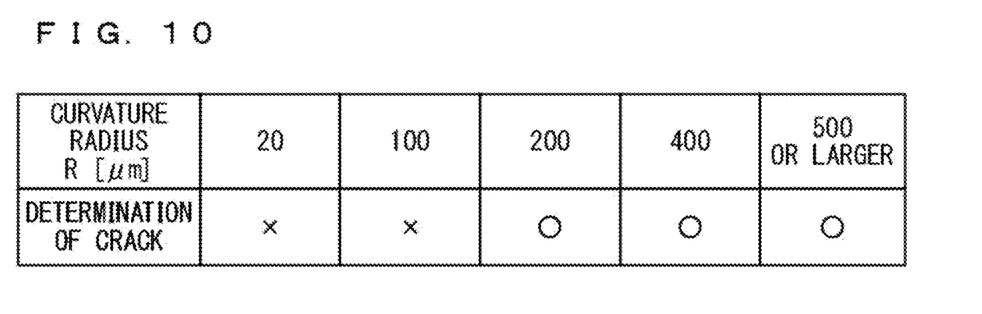
FIG. 10 A drawing illustrating a relationship between a curvature radius of a corner part and an occurrence of a crack after the heat cycle test.

Examined next is a relationship between the curvature radius of the corner portion of the polyimide member 3b in a plan view and the occurrence of crack after the heat cycle test. FIG. 10 is a drawing showing a result thereof. In FIG. 10, a determination of crack x is assigned to the semiconductor element in which the crack has occurred, and a determination of crack ○ is assigned to the semiconductor element in which the crack has not been occurred. As illustrated in FIG. 10, when the curvature radius is equal to or larger than 200 μm, the determination of crack ○ is assigned. The reason of this is considered that the concentration of the stress occurring in the corner portion of the polyimide member 3b is reduced. It is also considered that when the curvature radius is large, a variation of the thickness of the Ni electrode 4 disposed on the protruding part 3a of corner portion of the polyimide member 3b and moreover, the thickness ratio is reduced, and as a result, the concentration of the stress is reduced.

Next, a method of manufacturing the semiconductor element 101 according to the present embodiment 2 is briefly exemplified. Firstly, a device surface is formed on a first main surface of the semiconductor substrate 1. The device surface is a surface on a source side of a MOSFET, for example. In this process, the Al electrode 2 in FIG. 8 constituting the wiring electrode is formed on the first main surface of the semiconductor substrate 1.

The Al electrode 2 is made of Al, an Al alloy, or a laminated body thereof. The Al electrode 2 is pattern-formed by etching using a resist pattern-formed by a photolithography process as a mask, for example. Next, a polyimide film which is to be the polyimide members 3b and 3c is formed to prevent a creeping discharge, for example. The polyimide film is formed by a spin-coating method, for example, and a thickness of the polyimide film ranges from 3 μm to 100 μm.

Next, the resist pattern-formed by the photolithography process is formed on the polyimide film. Then, the etching is performed using a resist pattern as a mask, thereby forming the polyimide members 3b and 3c. Next, the Ni electrode 4 is formed on the Al electrode 2 exposed from the opening part of the polyimide member 3c. The Ni electrode 4 is formed by an electroless plating process, for example. An Au film covering the Ni electrode 4 may be formed for preventing oxidization of the Ni electrode 4.

The plurality of semiconductor element 101 are normally manufactured in the same semiconductor wafer. Thus, FIG. 7, for example, is a drawing focusing on one of the plurality of semiconductor elements 101 manufactured in parallel. The semiconductor wafer is used as a semiconductor substrate or a semiconductor base in the plurality of semiconductor elements 101. Immediately after the manufacture of the semiconductor element 101 is completed, the plurality of the semiconductor elements 101 are connected to each other via the semiconductor base, thus each of the semiconductor elements 101 are separated by a dicing process.

According to the semiconductor element 101 in the present embodiment 2 described above, the curvature radius of part where the protruding part 3a is formed is equal to or larger than 200 μm, and the thickness ratio is equal to or larger than 0.4. According to such a configuration, the occurrence of crack in the corner portion, for example, can be suppressed.

Embodiment 3

Figure 11:
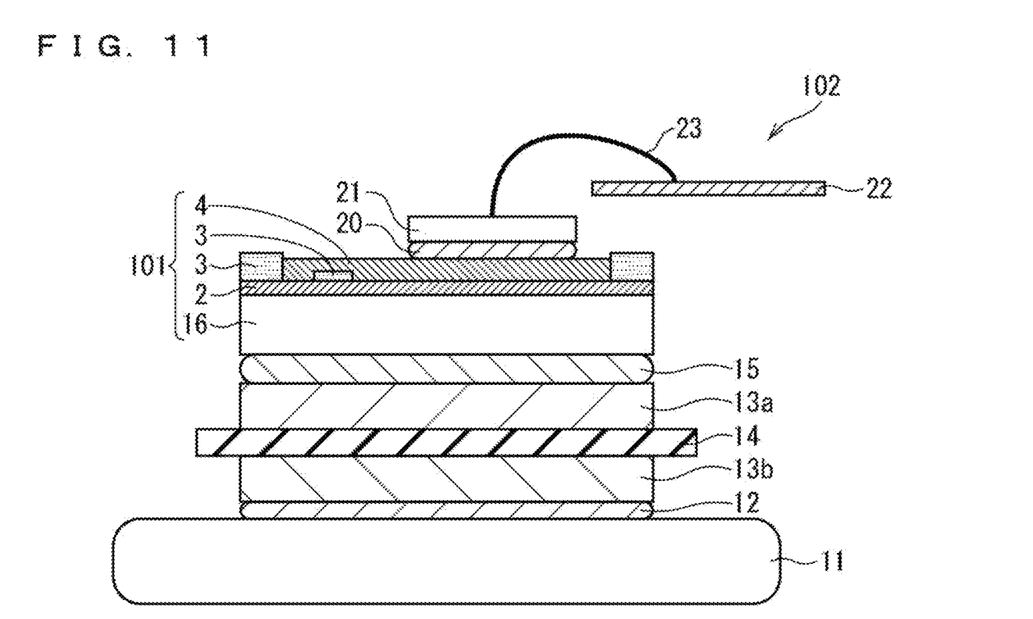
FIG. 11 A cross-sectional view illustrating a configuration of a semiconductor element according to an embodiment 3.

FIG. 11 is a cross-sectional view illustrating a structure of a semiconductor device 102 according to an embodiment 3. The semiconductor device 102 in FIG. 11 includes the semiconductor element 101, a die bond material 15 which is a first bonding material, an insulating substrate 14, a bonding material 12 which is a second bonding material, a cooling member 11, a buffer plate 21, a bonding material 20 which is a third bonding material, a copper plate 22, and a wiring 23.

The semiconductor element 101 is bonded to one surface of the buffer plate 21 via the bonding material 20. The buffer plate 21 includes a copper plate and an invar, for example. The other surface of the buffer plate 21 is connected to the wiring 23. Accordingly, the wiring 23 is electrically connected to the semiconductor element 101. The wiring includes Al or Cu, and is made of Al, an Al alloy, Cu, a Cu alloy, and a composite material thereof, for example. The buffer plate 21 is electrically connected to the copper plate 22 via the wiring 23.

The insulating substrate 14 is an insulating ceramics as an insulating plate, for example, and includes one surface on which a conductive plate 13a being a first conductive plate is provided and the other surface on which a conductive plate 13b being a second conductive plate is provided. In other words, the insulating substrate 14 is located to be sandwiched between the conductive plate 13a and the conductive plate 13b. The conductive plate 13a, the conductive plate 13b, and the insulating substrate 14 are previously integrated with each other using a brazing material, for example.

The conductive plate 13a has contact with the die bond material 15. Thus, the semiconductor element 101 is provided on the conductive plate 13a on the insulating substrate 14 via the die bond material 15, and is indirectly bonded to the conductive plate 13a. However, in a configuration that the semiconductor element 101 and the insulating substrate 14 are bonded by a direct bonding such as Cu solid-phase diffusion bonding or ultrasonic bonding, an interface between the semiconductor element 101 and the insulating substrate 14 functions as the first bonding material, thus the die bond material 15 may be omitted.

The conductive plate 13b faces the cooling member 11, and is bonded to the cooling member 11 via the bonding material 12. Accordingly, the cooling member 11 is bonded to the conductive plate 13b on the insulating substrate 14 via the bonding material 12.

The semiconductor element 101 according to the present embodiment 3 includes the Al electrode 2, the polyimide member 3, the Ni electrode 4, and a semiconductor base 16. The semiconductor element 101 further includes a back surface external output electrode not shown on a surface opposite to a surface (a lower side in the drawing) where the Al electrode 2 is formed. The semiconductor base 16 has a configuration similar to the semiconductor substrate 1 described in the embodiments 1 and 2, and the semiconductor element 101 according to the present embodiment 3 has a configuration similar to the semiconductor element 101 described in the embodiments 1 and 2.

A base material of the semiconductor base 16 may be Si or SiC, for example. The wide band gap semiconductor such as SiC has the larger band gap than Si, thus it is advantageous to adopt this to the semiconductor base 16 from a viewpoint that an insulation breakdown field strength of the semiconductor element 101 is increased and the semiconductor element 101 is operated under a high temperature equal to or larger than 175° C. Described hereinafter is an example of a case where the semiconductor base 16 is an SiC base.

The Al electrode 2 is a wiring electrode disposed on the semiconductor substrate 1. The wiring electrode is not limited to an electrode including Al, however, any metal layer made of Al, Cu, AlSi, Ni, or Au, for example, or a combination thereof may also be applicable. The above back surface external output electrode not shown may be any metal layer made of Al, AlSi, Ni, or Au, for example, or a combination thereof may also be applicable.

Applicable to the die bond material 15 is a low temperature sintered material of silver nanoparticles, a liquid phase diffusion bonding material such as Cu—Sn or Ag—Sn, or a bonding material which is an electrical or thermal good conductor such as solder.

An electrical or thermal good conductor such as copper, aluminum, or an alloy of these materials, for example, is applicable to the conductive plates 13a and 13b. When copper is adopted to the conductive plates 13a and 13b, a thickness thereof ranges from 0.2 to 1.0 mm and a linear expansion coefficient thereof is 17 ppm, for example.

Applicable to the insulating substrate 14 is ceramics which is an insulating body in an electrical viewpoint and a thermal good conductor, such as silicon nitride, aluminum nitride, or alumina. When silicon nitride is adopted to the insulating substrate 14, a thickness thereof ranges from 0.1 to 1.00 mm and a linear expansion coefficient thereof is 2.5 ppm, for example. The linear expansion coefficient as a whole of the insulating substrate 14 combining the conductive plates 13a and 13b described above can be estimated to 5.7 to 8.9 ppm, for example.

Applicable to the bonding material 12 is a low temperature sintered material of silver nanoparticles, a liquid phase diffusion bonding material such as Cu—Sn or Ag—Sn, or a bonding material which is a thermal good conductor such as solder, for example. When the bonding is performed by soldering, it is preferable to pay attention to a yield stress of a solder material, and a high-intensity solder such as Sn—Cu—Sb, for example, is preferable.

The cooling member 11 is formed of a metal material such as copper or aluminum, for example, having a good thermal conductivity.

According to such a configuration, a thermal resistance from the semiconductor element 101 to the cooling member 11 is small. Accordingly, the heat from the semiconductor element 101 is transmitted to the cooling member 11 by an excellent thermal conductivity. The thermal stress caused by the difference between the thermal expansion coefficient of the semiconductor element 101 and the thermal expansion coefficient of the cooling member 11 is mostly absorbed by a plastic deformation of the semiconductor element 101. Thus, a reliability of the bonding between the insulating substrate 14 and the cooling member 11 is sufficiently ensured.

Generally, a flexure occurs in the semiconductor device 102 in accordance with the difference between the linear expansion coefficient of the cooling member 11 which is the thermal good conductor and the linear expansion coefficient of the insulating substrate 14 and the semiconductor element 101 in the heat cycle test. Thus, the stress occurring in the die bond material 15 increases with increase in this flexure.

In a direct cooling module structure used in the present embodiment 3, the bonding material 12 to which the solder is adopted, for example, is directly connected to the cooling member 11. The cooling member 11 is bonded to the insulating substrate 14, to which the semiconductor element 101 is die-bonded, via the bonding material 12. Thus, the flexure caused by the difference between the linear expansion coefficient of the cooling member 11 and the linear expansion coefficient of the insulating substrate 14 and the semiconductor element 101 easily occurs.

Thus, a base plate (not shown) including a copper material is preferably bonded to the cooling member 11 via a grease. In this case, the insulating substrate 14 to which the semiconductor element 101 is die-bonded is bonded to the base plate via a bonding material to which solder is adopted, for example. Accordingly, the flexure caused by the difference between the linear expansion coefficient of the cooling member 11 and the linear expansion coefficient of the insulating substrate 14 and the semiconductor element 101 is reduced by the grease and the base plate, thus the flexure is reduced compared to the case of the direct cooling module structure. That is to say, the stress occurring in the die bond material 15 is reduced.

Embodiment 4

Figure 12:
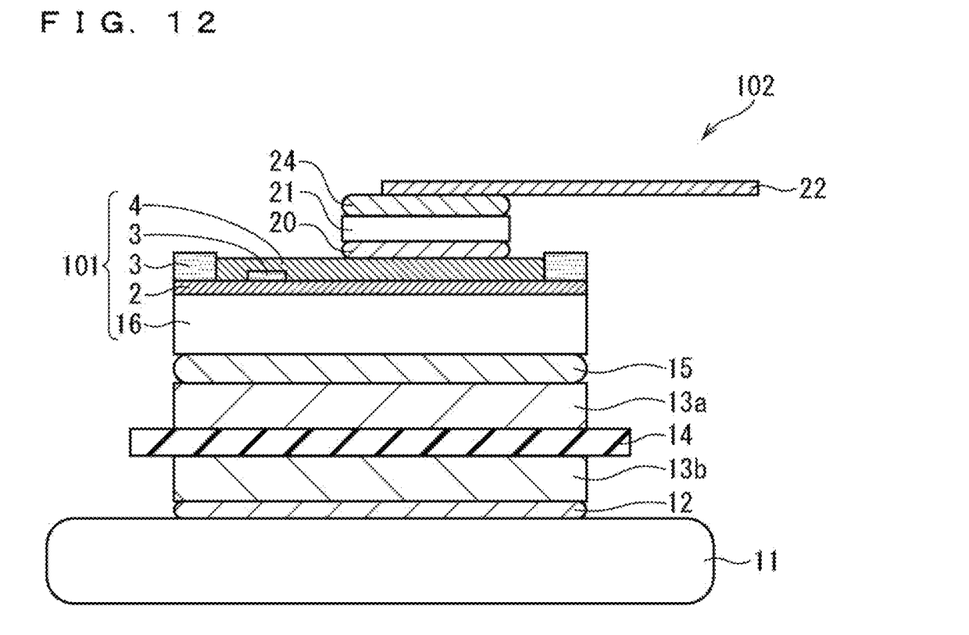
FIG. 12 A cross-sectional view illustrating a configuration of a semiconductor element according to an embodiment 4.

FIG. 12 is a cross-sectional view illustrating a structure of the semiconductor device 102 according to a present embodiment 4. In the semiconductor device 102 in FIG. 12, the copper plate 22 is bonded to the buffer plate 21 by a bonding material 24 in place of the wiring 23 in the semiconductor device 102 according to the embodiment 3.

That is to say, the buffer plate 21 includes one surface bonded to the semiconductor element 101 via the bonding material 20 and the other surface connected to the copper plate 22 which is the metal plate by the bonding material 24. The copper plate 22 is electrically connected to the semiconductor element 101. The other configuration of the semiconductor device 102 according to the present embodiment 4 is similar to the semiconductor device 102 according to the embodiment 3.

In the above configuration, applicable to the bonding material 24 bonding the buffer plate 21 and the copper plate 22 is a low temperature sintered material of silver nanoparticles, a silver paste material, a liquid phase diffusion bonding material such as Cu—Sn or Ag—Sn, or a bonding material which is a thermal good conductor such as solder, for example. When the bonding is performed by soldering, it is preferable to pay attention to a yield stress of a solder material, and a high-intensity solder such as Sn—Cu—Sb, for example, is preferable.

The semiconductor element 101 according to the present embodiment 4 is similar to the semiconductor device 101 according to the embodiment 3. The semiconductor element 101 according to the present embodiment 4 is bonded to one surface of the insulating substrate 14 via the die bond material 15. The other surface of the insulating substrate 14 is bonded to the cooling member 11 via the bonding material 12. The insulating substrate 14 is an insulating ceramics as an insulating plate, for example, and includes one surface on which a conductive plate 13a being a first conductive plate is provided and the other surface on which a conductive plate 13b being a second conductive plate is provided. In other words, the insulating substrate 14 is located to be sandwiched between the conductive plate 13a and the conductive plate 13b. The conductive plate 13a, the conductive plate 13b, and the insulating substrate 14 are previously integrated with each other using a brazing material, for example.

Embodiment 5

A power conversion device according to an embodiment 5 of the present invention is a power conversion device including a main conversion circuit having a silicon carbide semiconductor element according to any one of the embodiments 1 to 4. Although the semiconductor element described above is not limited to a specific power conversion device, described hereinafter as the present embodiment 5 is a case of applying the semiconductor element according to any one of the embodiments 1 to 4 to a three-phase inverter.

Figure 13:
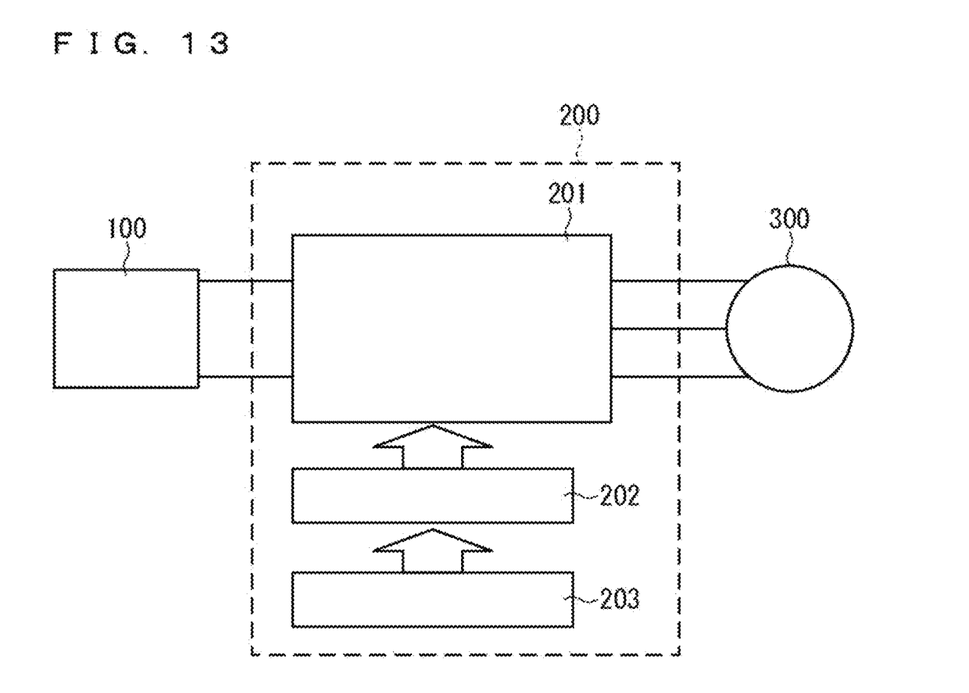
FIG. 13 A block diagram illustrating a configuration of a power conversion device according to an embodiment 5.

FIG. 13 is a block diagram illustrating a configuration of a power conversion system applying the power conversion device according to the present embodiment 5.

The power conversion system illustrated in FIG. 13 is made up of a power source 100, a power conversion device 200, and a load 300. The power source 100, which is a direct current power source, supplies a direct current power to the power conversion device 200. The power source 100 can be made up of various types of power sources, thus may be made up of a direct-current system, a solar battery, or a storage battery, or may be made up of a rectification circuit connected to an alternating-current system or an AC/DC converter, for example. The power source 100 may also be made up of a DC/DC converter which converts a direct current power being output from the direct current system into a predetermined power.

The power conversion device 200, which is a three-phase inverter connected between the power source 100 and the load 300, converts the direct current power supplied from the power source 100 into the alternating current power to supply the alternating current power to the load 300. As illustrated in FIG. 13, the power conversion device 200 includes a main conversion circuit 201 converting the direct current power which has been input into the alternating current power and outputting the alternating current power, a drive circuit 202 outputting a drive signal for driving each switching element in the main conversion circuit 201, and a control circuit 203 outputting a control signal for controlling the drive circuit 202 to the drive circuit 202.

The load 300 is a three-phase electrical motor driven by the alternating current power supplied from the power conversion device 200. The load 300 is not for specific purpose of use but is the electrical motor mounted on various types of electrical devices, thus it is used as the electrical motor for a hybrid car, an electrical car, a rail vehicle, an elevator, or an air-conditioning equipment, for example.

The power conversion device 200 is described in detail hereinafter. The main conversion circuit 201 includes a switching element and a reflux diode (not shown), and when a switching is performed on the switching element, the direct current power supplied from the power source 100 is converted into the alternating current power and then supplied to the load 300. Herein, the gate voltage turning off the switching element may be the same voltage as the source voltage, or may also be set to a minus side compared to the source voltage. The main conversion circuit 201 includes various types of specific circuit configurations, and the main conversion circuit 201 according to the present embodiment 5 is a three-phase full-bridge circuit having two levels, and the three-phase full-bridge circuit can be made up of six switching elements and six reflux diodes being antiparallel to each of the switching elements. The silicon carbide semiconductor element according to any one of the embodiments 1 to 4 described above is applied to each switching element of the main conversion circuit 201. That is to say, the main conversion circuit 201 includes the semiconductor device including the silicon carbide semiconductor element according to any one of claims 1 to 4. The two switching elements among the six switching elements are series-connected to each other to constitute upper and lower arms, and each of the upper and lower arms constitutes each phase (U-phase, V-phase, and W-phase) of the full-bridge circuit. An output terminal of each of the upper and lower arms, that is to say, three output terminals of the main conversion circuit 201 are connected to the load 300.

The drive circuit 202 generates the drive signal for driving the switching element of the main conversion circuit 201, and supplies the drive signal to a control electrode of the switching element of the main conversion circuit 201. Specifically, the drive circuit 202 outputs the drive signal for switching the switching element to an ON state and the drive signal for switching the switching element to an OFF state to the control electrode of each switching element in accordance with the control signal from the control circuit 203 described hereinafter. The drive signal is a voltage signal (ON signal) equal to or higher than a threshold voltage of the switching element when the switching element is kept in the ON state, and the drive signal is a voltage signal (OFF signal) equal to or lower than the threshold voltage of the switching element when the switching element is kept in the OFF state.

The control circuit 203 controls the switching element of the main conversion circuit 201 to supply a desired power to the load 300. Specifically, the control circuit 203 calculates a time when each switching element of the main conversion circuit 201 needs to enter the ON state (ON time), based on the electrical power which needs to be supplied to the load 300. For example, the control circuit 203 can control the main conversion circuit 201 by performing pulse width modulation (PWM) control for modulating the ON time of the switching element in accordance with the voltage which needs to be output. Then, the control circuit 203 outputs a control instruction (control signal) to the drive circuit 202 so that the drive circuit 202 outputs the ON signal to the switching element which needs to enter the ON state and outputs the OFF signal to the switching element which needs to enter the OFF state at each time. The drive circuit 202 outputs the ON signal or the OFF signal as the drive signal to the control electrode of each switching element in accordance with the control signal.

In the power conversion device according to the present embodiment 5 described above, the silicon carbide semiconductor element according to any one of the embodiments 1 to 4 is applied to the switching element in the main conversion circuit 201, thus the power conversion device in which a corrosion resistance is increased can be achieved.

Although the example of applying the semiconductor element according to any one of the embodiments 1 to 4 to the three-phase inverter having the two levels is described in the present embodiment 5 described above, the present embodiment 5 is not limited thereto, but can be applied to the various power conversion devices. Although the power conversion device according to the present embodiment 5 is the power conversion device having the two levels, a power conversion device having three or multiple levels may also applied. The semiconductor element described above may be applied to a single-phase inverter when the electrical power is supplied to a single-phase load. The semiconductor element described above can be applied to a DC/DC converter or an AC/DC converter when the electrical power is supplied to a direct current load, for example.

The load in the power conversion device according to the present embodiment 5 is not limited to the electrical motor as described above, but an electrical discharge machine or a laser beam machine may also be the load. The power conversion device can also be used as a power-supply device of an induction heat cooking device or a non-contact power feeding system, and can also be further used as a power conditioner of a solar power system or an electricity storage system, for example.

According to the present invention, each embodiment can be arbitrarily combined, or each embodiment can be appropriately varied or omitted within the scope of the invention.

Although the present invention is described in detail, the foregoing description is in all aspects illustrative and does not restrict the invention. It is therefore understood that numerous modifications and variations can be devised without departing from the scope of the invention.

EXPLANATION OF REFERENCE SIGNS 1 semiconductor substrate, 2 Al electrode, 3, 3b, 3c polyimide member, 3a protruding part, 4 Ni electrode, 11 cooling member, 12, 20 bonding material, 13a, 13b conductive plate, 14 insulating substrate, 15 die bond material, 16 semiconductor base, 21 buffer plate, 22 copper plate, 23 wiring, 101 semiconductor element, 102 semiconductor device.

The invention claimed is:

1. A semiconductor element, comprising:
a base including a semiconductor;
a first electrode disposed on the base; and
an organic resin member selectively disposed on the first electrode, wherein
the organic resin member includes a protruding part which protrudes in a plane direction of an upper surface of the first electrode and which has a lower portion having contact with the first electrode in a cross-sectional view, in at least part of a peripheral portion of the organic resin member in a top view,
the semiconductor element further comprises
a second electrode disposed on the first electrode and the protruding part, and
the at least the part of the peripheral portion of the organic resin member includes a portion with a convex shape extending outside from the peripheral portion of the organic resin member in a plan view.

2. The semiconductor element according to claim 1, wherein
an upper surface of the protruding part is inclined with respect to an upper surface of the first electrode.

3. The semiconductor element according to claim 1, wherein
the first electrode includes Al,
the second electrode includes Ni,
the organic resin member includes a polyimide member, and
the at least the part of the peripheral portion of the organic resin member includes a portion having a curvature radius equal to or larger than 200 μm in the peripheral portion of the organic resin member in a plan view.

4. The semiconductor element according to claim 1, wherein
the first electrode includes Al,
the second electrode includes Ni,
the organic resin member includes a polyimide member, and
a ratio of a minimum thickness of the second electrode disposed on the protruding part to a thickness of the second electrode disposed on the first electrode is equal to or larger than 0.4.

5. The semiconductor element according to claim 1, wherein
the first electrode includes Al,
the second electrode includes Ni,
the organic resin member includes a polyimide member, and
the thickness of the second electrode disposed on the first electrode is equal to or larger than 10 nm and equal to or smaller than 100 μm.

6. A semiconductor device, comprising:
the semiconductor element according to claim 1;
an insulating substrate including one surface on which a first conductive plate bonded to the semiconductor element via a first bonding material is provided and another surface on which a second conductive plate is provided;
a wiring electrically connected to the semiconductor element; and
a cooling member bonded to the second conductive plate via a second bonding material.

7. The semiconductor device according to claim 6, further comprising
a buffer plate including one surface bonded to the semiconductor element via a third bonding material and another surface connected to the wiring.

8. The semiconductor device according to claim 6, wherein
the wiring includes Al or Cu.

9. A semiconductor device, comprising:
the semiconductor element according to claim 1;
an insulating substrate including one surface on which a first conductive plate bonded to the semiconductor element via a first bonding material is provided and another surface on which a second conductive plate is provided;
a metal plate electrically connected to the semiconductor element; and
a cooling member bonded to the second conductive plate via a second bonding material.

10. The semiconductor device according to claim 9, further comprising
a buffer plate including one surface bonded to the semiconductor element via a third bonding material and another surface connected to the metal plate.

11. A power conversion device, comprising:
a main conversion circuit having the semiconductor device including the semiconductor element according to claim 1, and converting an electrical power being input to the main conversion circuit and outputting a converted electrical power;
a drive circuit outputting a control signal for controlling the semiconductor device to the semiconductor device; and
a control circuit outputting a control signal for controlling the drive circuit to the drive circuit.

12. A method of manufacturing the semiconductor element according to claim 1, wherein
the organic resin member is formed by performing etching using a resist pattern-formed by a photolithography process as a mask.

13. A semiconductor element, comprising:
a base including a semiconductor;
a first electrode disposed on the base; and
an organic resin member selectively disposed on the first electrode, wherein
the organic resin member includes a protruding part which protrudes in a plane direction of an upper surface of the first electrode and which has a lower portion having contact with the first electrode in a cross-sectional view, in at least part of a peripheral portion of the organic resin member in a top view,
the semiconductor element further comprises
a second electrode disposed on the first electrode and the protruding part,
the first electrode includes Al,
the second electrode includes Ni,
the organic resin member includes a polyimide member, and
the at least the part of the peripheral portion of the organic resin member includes a portion having a curvature radius equal to or larger than 200 μm in the peripheral portion of the organic resin member in a plan view.

* * * * *